United States Patent
Kang

(10) Patent No.: US 10,186,304 B2
(45) Date of Patent: Jan. 22, 2019

(54) MEMORY DEVICE AND A CLOCK DISTRIBUTION METHOD THEREOF

(71) Applicant: SAMSUNG ELECTRONICS CO., LTD., Suwon-si, Gyeonggi-Do (KR)

(72) Inventor: Sang-Kyu Kang, Anyang-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/692,132

(22) Filed: Aug. 31, 2017

(65) Prior Publication Data

US 2018/0082726 A1   Mar. 22, 2018

(30) Foreign Application Priority Data

Sep. 19, 2016 (KR) .................. 10-2016-0119393

(51) Int. Cl.
```
G11C 7/22        (2006.01)
G06F 3/06        (2006.01)
G06F 12/02       (2006.01)
G06F 12/0891     (2016.01)
G11C 5/04        (2006.01)
G11C 7/02        (2006.01)
G11C 7/10        (2006.01)
H01L 25/10       (2006.01)
```
(52) U.S. Cl.
CPC ............ *G11C 7/222* (2013.01); *G06F 3/0629* (2013.01); *G06F 12/0246* (2013.01); *G06F 12/0891* (2013.01); *G11C 5/04* (2013.01); *G11C 7/02* (2013.01); *G11C 7/1075* (2013.01); *G11C 7/225* (2013.01); *H01L 25/105* (2013.01); *G11C 7/1057* (2013.01); *G11C 7/1066* (2013.01); *G11C 7/1084* (2013.01); *G11C 7/1093* (2013.01)

(58) Field of Classification Search
CPC .................................................. G11C 7/22
USPC ..................................................... 365/233.1
See application file for complete search history.

(56) References Cited

U.S. PATENT DOCUMENTS

| | | | | |
|---|---|---|---|---|
| 6,972,998 B1 * | 12/2005 | Gibson | ............... | G11C 7/1051 365/189.05 |
| 7,069,458 B1 * | 6/2006 | Sardi | .................... | H03L 7/0996 327/152 |
| 7,132,854 B1 * | 11/2006 | Chen | .................... | G11C 7/1006 326/46 |
| 7,269,699 B2 | 9/2007 | Jang | | |

(Continued)

*Primary Examiner* — Min Huang
(74) *Attorney, Agent, or Firm* — F. Chau & Associates, LLC

(57) ABSTRACT

A memory device includes a first data buffer receiving data of a first frequency band or a second frequency band, a first clock buffer providing a clock signal of the first frequency band to the first data buffer when the first data buffer receives the data of the first frequency band and providing a clock signal of the second frequency band to the first data buffer when the first data buffer receives the data of the second frequency band, a second data buffer receiving the data of the first frequency band or the second frequency band and receiving the clock signal of the second frequency band from the first clock buffer in response to receiving the data of the second frequency band, and a second clock buffer providing the clock signal of the first frequency band to the second data buffer in a first frequency band operation.

20 Claims, 10 Drawing Sheets

(56) References Cited

U.S. PATENT DOCUMENTS

| | | |
|---|---|---|
| 7,768,867 B2 | 8/2010 | Nishio et al. |
| 8,019,907 B2 | 9/2011 | Talbot |
| 8,037,338 B2 | 10/2011 | Lee |
| 8,391,090 B2 | 3/2013 | Koshizuka |
| 8,482,996 B2 | 7/2013 | Oh |
| 8,868,873 B2 | 10/2014 | Shaeffer et al. |
| 2002/0131307 A1* | 9/2002 | Murai ............... G11C 29/1201 365/200 |
| 2002/0145936 A1* | 10/2002 | Maeda ............... G11C 7/1051 365/233.1 |
| 2011/0069805 A1* | 3/2011 | Koyama ............ H03K 17/002 377/2 |
| 2012/0057413 A1* | 3/2012 | Yun ..................... G11C 7/22 365/189.05 |
| 2014/0176168 A1* | 6/2014 | Yoon ............... G11C 29/12015 324/750.3 |
| 2015/0187404 A1* | 7/2015 | Oh ..................... G11C 8/18 365/154 |
| 2016/0041578 A1* | 2/2016 | Lee ..................... G06F 1/10 713/400 |
| 2016/0125920 A1 | 5/2016 | Kim et al. |
| 2016/0170676 A1 | 6/2016 | Vogt |

\* cited by examiner

MEMORY DEVICE AND A CLOCK DISTRIBUTION METHOD THEREOF

CROSS-REFERENCE TO RELATED APPLICATION

This application claims priority under 35 U.S.C. § 119 to Korean Patent Application No. 10-2016-0119393 filed Sep. 19, 2016, in the Korean Intellectual Property Office, the disclosure of which is incorporated by reference herein in its entirety.

TECHNICAL FIELD

Exemplary embodiments of the inventive concept described herein relate to a semiconductor memory system, and more particularly, to a memory device and a clock distribution method thereof.

DISCUSSION OF RELATED ART

An electronic device can be configured to have various functions that are requested by consumers. As a result, power consumption of such electronic devices is increasing. For example, the power increase may be due to the electronic device's use of a high-integration, high-performance memory system.

The memory system may include a memory device such as a volatile memory device or a nonvolatile memory device. An example of the volatile memory device is a synchronous dynamic random access memory (SDRAM). The SDRAM processes input/output data and a command address signal in synchronization with a clock signal provided from a host. Accordingly, the quality of the clock signal can influence the operational quality of the memory device.

The clock signal is a signal that transitions at regular intervals. An input buffer of the memory device, which receives the clock signal, and a clock signal path inside the memory device consume electric power for each of the clock signal transition periods. Accordingly, power consumption of the memory device increases in proportion to an increase in a frequency of the clock signal.

SUMMARY

According to an exemplary embodiment of the inventive concept, a memory device includes first and second data buffer sets and first and second clock buffers. The first data buffer set receives data of a first frequency band or data of a second frequency band from a host. The second frequency band is lower in frequency than the first frequency band. The first clock buffer provides a clock signal of the first frequency band to the first data buffer set when the first data buffer set receives the data of the first frequency band and provides a clock signal of the second frequency band to the first data buffer set when the first data buffer set receives the data of the second frequency band. The second data buffer set receives the data of the first frequency band or the data of the second frequency band from the host and receives the clock signal of the second frequency band from the first clock buffer in response to receiving the data of the second frequency band. The second clock buffer provides the clock signal of the first frequency band to the second data buffer set in a first frequency band operation in which each of the first and second data buffer sets receives the data of the first frequency band.

According to an exemplary embodiment of the inventive concept, a clock signal providing method of a memory device includes determining a clock distribution method of the memory device such that first and second clock buffers included in the memory device provide a clock signal of a first frequency band to first and second data buffer sets included in the memory device respectively in a first frequency band operation and such that the first clock buffer provides a clock signal of a second frequency band to each of the first and second data buffer sets in a second frequency band operation, wherein the second frequency band is lower in frequency than the first frequency band; and setting, at the memory device, the determined clock distribution method for each of the first and second frequency bands of the clock signals when the memory device receives data from a host.

According to an exemplary embodiment of the inventive concept, a memory device comprises: a first clock buffer configured to receive a first clock signal pair and output a first internal clock signal that corresponds to one of the first clock signal pair in response to a control signal; a first data buffer set configured to receive the first internal clock signal; a second clock buffer configured to receive a second clock signal pair and output a second internal clock signal that corresponds to one of the second clock signal pair in response to the control signal; a multiplexer configured to receive the first and second internal clock signals and output one of the first and second internal clock signals as a third internal clock signal in response to the control signal; and a second data buffer set configured to receive the third internal clock signal.

DETAILED DESCRIPTION OF THE EMBODIMENTS

Figure 1:
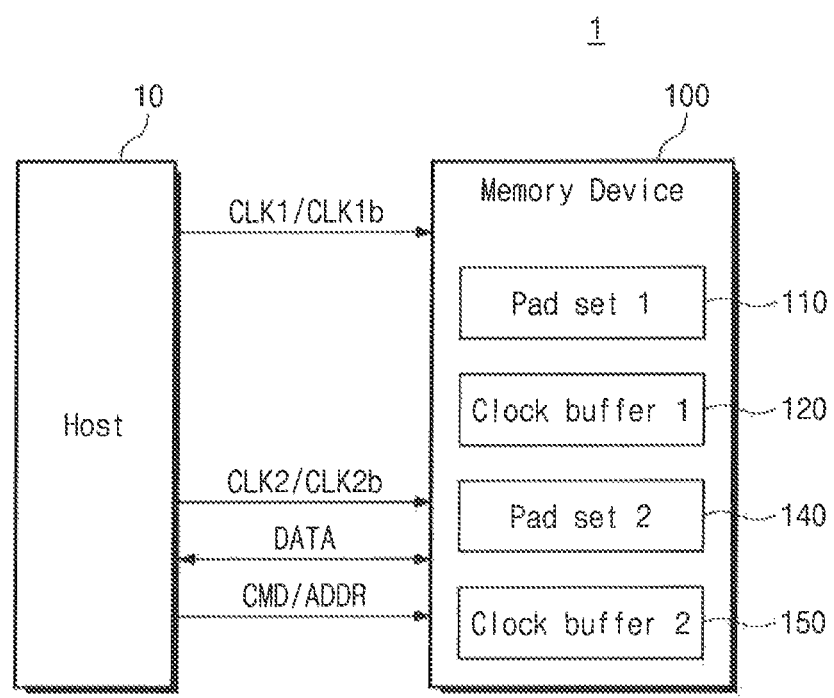
FIG. 1 is a block diagram illustrating a memory system including a memory device, according to an exemplary embodiment of the inventive concept.

Below, exemplary embodiments of the inventive concept will be described in detail with reference to the accompanying drawings. In the drawings, like reference numerals may refer to like parts.

FIG. 1 is a block diagram illustrating a memory system including a memory device according to an exemplary embodiment of the inventive concept. Referring to FIG. 1, a memory system 1 may include a host 10 and a memory device 100. For example, the memory system 1 may be a single system that includes both the host 10 and the memory device 100. Additionally, the host 10 and the memory device 100 may be implemented with separate devices, respectively.

For example, the host 10 may be a processor circuit that includes a general-purpose processor or an application processor, or a memory system. Additionally, the host 10 may be the following computing device including one or more processors: a personal computer, a peripheral device, a digital camera, personal digital assistant (PDA), a portable media player (PMP), a smartphone, or a wearable device. However, the inventive concept is not limited thereto.

The memory device 100 may store data provided from the host 10 or data to be provided to the host 10. The memory device 100 may be any of a variety of storage mediums. For example, the storage mediums may include a volatile memory. For example, the memory device 100 may include a dynamic random access memory (DRAM), a static RAM (SRAM), a thyristor RAM (TRAM), a zero capacitor RAM (Z-RAM), a twin transistor RAM (TTRAM), a magnetoresistive RAM (MRAM), etc. Exemplary embodiments of the inventive concept may be also applied to any of a variety of storage mediums including a volatile memory. For example, the memory device 100 may include an unbuffered dual in-line memory module (UDIMM), a registered DIMM (RDIMM), a load reduced DIMM (LRDIMM), a Non Volatile DIMM (NVDIMM), etc. However, the inventive concept is not limited thereto.

Below, for ease of description, it is assumed that the memory device 100 includes a single memory device. However, as described above, the memory device 100 may include more than one storage device and further exemplary embodiments of the inventive concept are applied to various storage devices.

The memory device 100 may communicate with the host 10. For example, the memory device 100 may communicate with the host 10 based on one or more of various wired communication protocols, such as a universal serial bus (USB), a small computer system interface (SCSI), peripheral component interconnect express (PCIe), a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), a transmission control protocol/Internet protocol (TCP/IP), and various wireless communication protocols, such as long term evolution (LTE), WiMax, global system for mobile communication (GSM), code division multiple access (CDMA), high speed packet access (HSPA), Bluetooth, near field communication (NFC), Wi-Fi, and radio frequency identification (RFID). However, the inventive concept is not limited thereto.

The memory device 100 may perform a write operation and a read operation in response to a command/address CMD/ADDR from the host 10. The write operation and the read operation of the memory device 100 are as follows.

In the case of the read operation, the host 10 provides active command and row address information to the memory device 100 together with a C/A clock signal dedicated to a command and an address. After a specific time, the host 10 provides a read command and a column address to the memory device 100 together with the C/A clock signal. Afterwards, the memory device 100 provides requested data to the host 10 after a specific time.

In the case of the write operation, the host 10 provides the active command and the row address to the memory device 100 together with the C/A clock signal. After a specific time, the host 10 provides a write command and the column address to the memory device 100 together with the C/A clock signal. Afterwards, the host 10 provides the memory device 100 with data to be written. In the case that the memory device 100 operates in synchronization with a clock signal, the memory device 100 may be provided with a data-dedicated clock signal from the host 10 upon receiving data "DATA" from the host 10. The memory device 100 synchronizes the provided data "DATA" with the data-dedicated clock signal. The memory device 100 writes the received data in a memory area of a designated address.

The memory device 100 according to an exemplary embodiment of the inventive concept may include a first pad set 110, a first clock buffer 120, a second pad set 140, and a second clock buffer 150. The memory device 100 may be provided with a first clock signal pair CLK1/CLK1b and a second clock signal pair CLK2/CLK2b dedicated to data from the host 10 in the write operation. For example, each of the first clock signal pair CLK1/CLK1b and the second clock signal pair CLK2/CLK2b may be a data strobe signal that is provided from the host 10 in the write operation of the memory device 100 or to the host 10 in the read operation of the memory device 100. Additionally, each of the first clock signal pair CLK1/CLK1b and the second clock signal pair CLK2/CLK2b may be a data-dedicated clock signal that is provided from the host 10 when the memory device 100 operates.

The first clock buffer 120 may be provided with the first clock signal pair CLK1/CLK1b from the host 10 through a first clock pad included in the first pad set 110. The second clock buffer 150 may be provided with the second clock signal pair CLK2/CLK2b from the host 10 through a second clock pad included in the second pad set 140.

On the basis of a frequency band of data provided from the host 10 to the memory device 100, the memory device 100 may be provided with one of the first clock signal pair CLK1/CLK1b and the second clock signal pair CLK2/CLK2b from the host 10 or with at least one clock signal of the first clock signal pair CLK1/CLK1b and the second clock signal pair CLK2/CLK2b from the host 10. On the basis of a frequency band of data provided from the host 10 to the memory device 100, each of the first and second clock buffers 120 and 150 may operate as a single input buffer, a differential input buffer or may not operate at all.

A frequency band of data may be a first frequency band, a second frequency band, or a third frequency band. For example, the first frequency band may include a clock frequency at which the memory device 100 operates with a maximum bandwidth. The third frequency band may include a clock frequency at which the memory device 100 operates with a minimum bandwidth. The second frequency band may be a frequency band between the first frequency band and the third frequency band. Below, it is assumed that the first frequency band is higher than the second frequency band and the second frequency band is higher than the third frequency band. However, the inventive concept is not limited thereto. As an example, the first frequency band may be higher in frequency than the second frequency band. In addition, the first frequency band may be greater in bandwidth than the second frequency band.

According to an exemplary embodiment of the inventive concept, the host 10 adjusts the number of clock signals to be provided to the memory device 100 based on a frequency band, and the memory device 100 changes a configuration of a clock buffer for receiving a clock signal based on a frequency band. Accordingly, the memory system 1 that includes the host 10 and the memory device 100 may optimize the quality of the clock signal and the efficiency of power consumption based on a frequency band.

Figure 2:
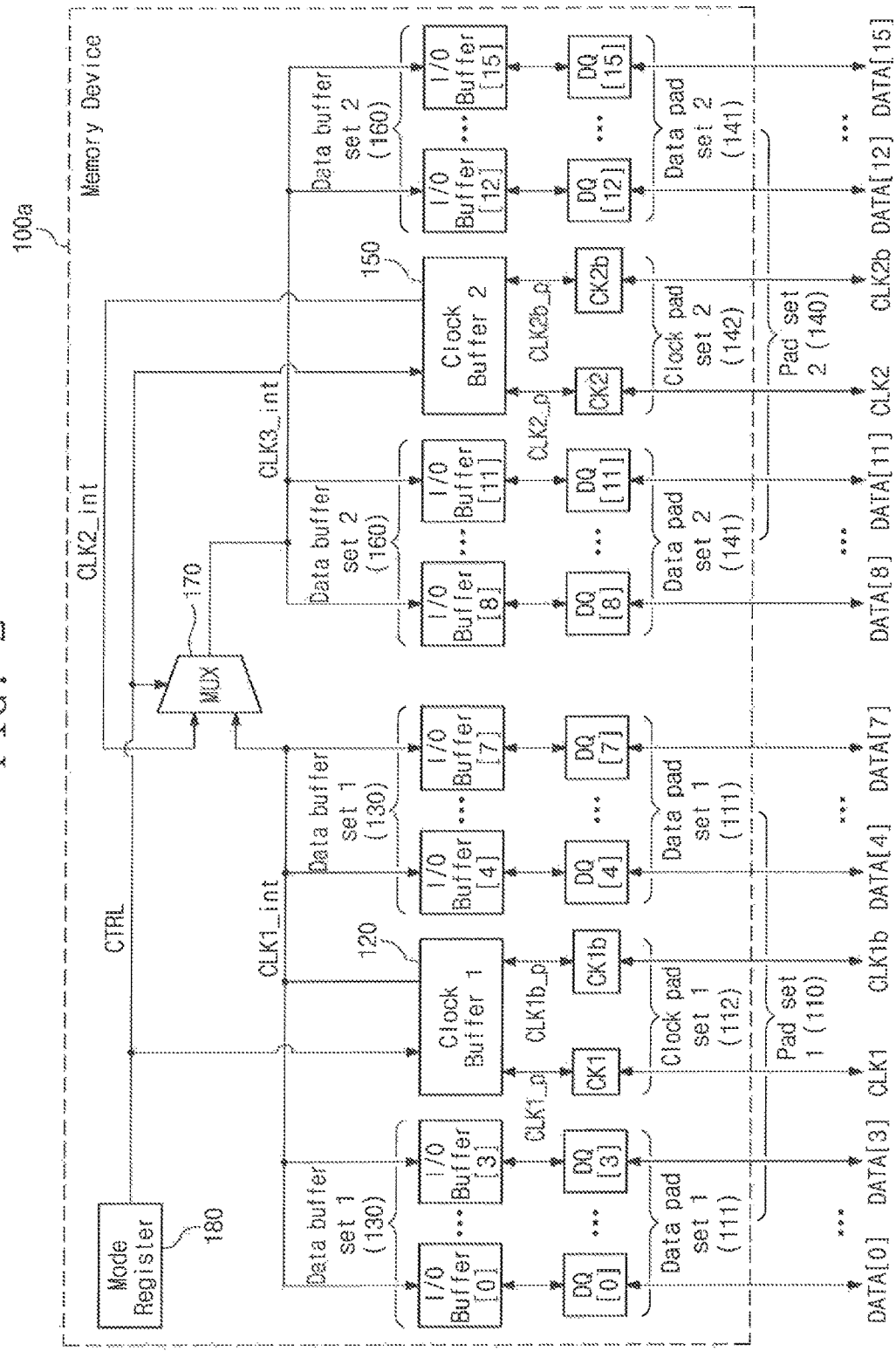
FIG. 2 is a block diagram illustrating a memory device illustrated in FIG. 1, according to an exemplary embodiment of the inventive concept.

FIG. 2 is a block diagram illustrating a memory device illustrated in FIG. 1, according to an exemplary embodiment of the inventive concept. A memory device 100a of FIG. 2 will be described with reference to FIG. 1. Referring to FIG. 2, the memory device 100a may include the first pad set 110, the first clock buffer 120, a first data buffer set 130, the second pad set 140, a second clock buffer 150, a second data buffer set 160, a multiplexer (MUX) 170, and a mode register 180. On the basis of a frequency band of data that the memory device 100a receives, the memory device 100a may change the number of clock signals, which each of the first and second clock buffers 120 and 150 is provided with, and a combination of a clock signal to be provided to each of the first and second data buffer sets 130 and 160.

The first pad set 110 may include a first data pad set 111 and a first clock pad set 112. The first data pad set 111 may include first to eighth data pads DQ[0:7]. In the write operation of the memory device 100a, the memory device 100a may be provided with first to eighth data DATA[0:7] from the host 10 through the first to eighth data pads DQ[0:7], respectively. Additionally, in the read operation of the memory device 100a, the memory device 100a may provide the first to eighth data DATA[0:7] to the host 10 through the first to eighth data pads DQ[0:7], respectively. The first to eighth data pads DQ[0:7] are respectively connected with first to eighth I/O buffers I/O Buffer[0:7] that are included in the first data buffer set 130.

The first clock pad set 112 may include a first clock pad CK1 and a first clock bar pad CK1b. In the write operation of the memory device 100a, the memory device 100a may be provided with a first clock signal CLK1 and a first clock bar signal CLK1b from the host 10 through the first clock pad CK1 and the first clock bar pad CK1b. The first clock pad CK1 and the first clock bar pad CK1b may be connected with the first clock buffer 120.

The first clock buffer 120 operates as a single input buffer or a differential input buffer based on a control code CTRL. For the first clock buffer 120 to operate as the single input buffer or the differential input buffer, the first clock buffer 120 may be provided with at least one clock signal of a first pad clock signal CLK1_p and a first pad clock bar signal CLK1b_p that are respectively provided through the first clock pad CK1 and the first clock bar pad CK1b. The first clock buffer 120 generates a first internal clock signal CLK1_int based on a provided clock signal. The first internal clock signal CLK1_int is provided to the first to eighth I/O buffers I/O Buffer[0:7] of the first data buffer set 130 and the multiplexer 170. An exemplary configuration of the first clock buffer 120 will be described with reference to FIGS. 3 and 4.

The first data buffer set 130 may include the first to eighth I/O buffers I/O Buffer[0:7]. In the write operation or the read operation of the memory device 100a, the first to eighth I/O buffers I/O Buffer[0:7] may exchange data with the host 10 through the first to eighth data pads DQ[0:7], respectively. In addition, when the first to eighth I/O buffers I/O Buffer[0:7] receive data from the host 10 respectively, each of the first to eighth I/O buffers I/O Buffer[0:7] may synchronize its data with the first internal clock signal CLK1_int that is provided from the first clock buffer 120.

In FIG. 2, an exemplary embodiment of the inventive concept is illustrated with the first clock pad set 112 being arranged between the first to fourth data pads DQ[0:3] and the fifth to eighth data pads DQ[4:7] and with the first clock buffer 120 being arranged between the first to fourth I/O buffers I/O Buffer[0:3] and the fifth to eighth I/O buffers I/O Buffer[4:7]. This arrangement allows the first internal clock signal CLK1_int generated through the first clock pad set 112 and the first clock buffer 120 to be provided to each of the first to eighth I/O buffers I/O Buffer[0:7] as equally as possible. It is to be understood, however, that the first to eighth data pads DQ[0:7], the first clock pad CK1, and the first clock bar pad CK1b may be arranged different from that illustrated in FIG. 2. Furthermore, the first to eighth I/O buffers I/O Buffer[0:7] and the first clock buffer 120 may be arranged different from that illustrated in FIG. 2.

In FIG. 2, an exemplary embodiment of the inventive concept is illustrated so that each of the first and second clock buffers 120 and 150 provides a clock signal to eight I/O buffers. However, the inventive concept is not limited thereto. For example, each of the first and second clock buffers 120 and 150 may be configured to provide a clock signal to I/O buffers of which the number is 7 or less or 9 or more.

As described above, each of the first and second clock signal pairs CLK1/CLK1b and CLK2/CLK2b may be a data strobe signal. The data strobe signal may be provided from the host 10 in the write operation of the memory device 100a or may be provided to the host 10 in the read operation of the memory device 100a. Accordingly, in the case where each of the first and second clock signal pairs CLK1/CLK1b and CLK2/CLK2b is the data strobe signal, as illustrated in FIG. 2, the first and second clock signal pairs CLK1/CLK1b and CLK2/CLK2b, the first pad clock pair CLK1_p and CLK1b_p, and the second pad clock pair CLK2_p and CLK2b_p may be provided in both directions, e.g., a direction of the memory device 100a and a direction of the host 10.

Additionally, each of the first clock signal pair CLK1/CLK1b and the second clock signal pair CLK2/CLK2b may be the data-dedicated clock signal that is provided from the host 10 when the memory device 100a operates. The data-dedicated clock signal may be provided from the host 10 when the memory device 100a performs the write operation, the read operation, etc. Accordingly, in the case where each of the first and second clock signal pairs CLK1/CLK1b and CLK2/CLK2b is the data-dedicated clock signal, as illustrated in FIG. 2, the first and second clock signal pairs CLK1/CLK1b and CLK2/CLK2b, the first pad clock pair CLK1_p and CLK1b_p, and the second pad clock pair CLK2_p and CLK2b_p may be provided from the host 10 in one direction, e.g., a direction of the first and second clock buffers 120 and 150.

Hereinafter, the expression that a clock signal is provided to the first data buffer set 130 may mean that the clock signal is provided to each of the first to eighth I/O buffers I/O Buffer[0:7] included in the first data buffer set 130. In addition, like the above description, the expression that a clock signal is provided to the second data buffer set 160 may mean that the clock signal is provided to each of ninth to sixteenth I/O buffers I/O Buffer[8:15] included in the second data buffer set 160.

The multiplexer 170 is provided with the first and second internal clock signals CLK1_int and CLK2_int from the first and second clock buffers 120 and 150, respectively. The multiplexer 170 outputs a clock signal, which is selected by the control code CTRL, of the first and second internal clock signals CLK1_int and CLK2_int as a third internal clock signal CLK3_int. The third internal clock signal CLK3_int is provided to the second data buffer set 160.

The mode register 180 may store the control code CTRL provided from the host 10. For example, the control code CTRL may be provided by a mode register set (MRS) command of the host 10. The mode register 180 may provide the control code CTRL to the first and second clock buffers 120 and 150 and the multiplexer 170. The control code CTRL may allow each of the first and second clock buffers 120 and 150 to operate as one buffer of the single input buffer and the differential input buffer. In addition, the control code CTRL may allow the multiplexer 170 to select one clock signal of the first and second internal clock signals CLK1_int and CLK2_int.

An operation of the memory device 100a that is based on a frequency band of data that the memory device 100a receives is as follows. First, when the memory device 100a receives data of a first frequency band from the host 10 (hereinafter referred to as a "first frequency operation"), the first data buffer set 130 may operate in response to the first internal clock signal CLK1_int provided from the first clock buffer 120. The multiplexer 170 outputs the second internal clock signal CLK2_int, which is selected by the control code CTRL, of the first and second internal clock signals CLK1_int and CLK2_int as the third internal clock signal CLK3_int. The second data buffer set 160 operates in response to the third internal clock signal CLK3_int from the multiplexer 170. Consequently, the second data buffer set 160 operates in response to the second internal clock signal CLK2_int. In this case, each of the first and second clock buffers 120 and 150 may operate as the differential input buffer. Hereinafter, a configuration in which each of the first and second clock buffers 120 and 150 operates as the differential input buffer, the first data buffer set 130 operates in response to the first internal clock signal CLK1_int, and the second data buffer set 160 operates in response to the second internal clock signal CLK2_int is referred to as a "first clock distribution method".

When the memory device 100a receives data of a second frequency band from the host 10 (hereinafter referred to as a "second frequency operation"), like in the clock distribution method corresponding to the first frequency operation, the first data buffer set 130 operates in response to the first internal clock signal CLK1_int, and the second data buffer set 160 operates in response to the second internal clock signal CLK2_int that is output as the third internal clock signal CLK3_int. However, in this case, each of the first and second clock buffers 120 and 150 may operate as the single input buffer. Since each of the first and second clock buffers 120 and 150 operates as the single input buffer (and not the differential input buffer), power consumption may decrease. Hereinafter, a configuration in which each of the first and second clock buffers 120 and 150 operates as the single input buffer, the first data buffer set 130 operates in response to the first internal clock signal CLK1_int, and the second data buffer set 160 operates in response to the second internal clock signal CLK2_int is referred to as a "second clock distribution method".

Additionally, in the second frequency operation, each of the first and second data buffer sets 130 and 160 may be controlled to operate in response to the first internal clock signal CLK1_int. The first data buffer set 130 operates in response to the first internal clock signal CLK1_int provided from the clock buffer 120. In this case, the multiplexer 170 outputs the first internal clock signal CLK1_int, which is selected by the control code CTRL, of the first and second internal clock signals CLK1_int and CLK2_int as the third internal clock signal CLK3_int. The second data buffer set 160 operates in response to the first internal clock signal CLK1_int that is output as the third internal clock signal CLK3_int.

Consequently, each of the first and second data buffer sets 130 and 160 operates in response to the first internal clock signal CLK1_int. In this case, since the control code CTRL allows the second clock buffer 150 not to operate and the memory device 100a does not operate one clock buffer upon receiving a clock signal, power consumption may decrease. Hereinafter, a configuration in which the first clock buffer 120 operates as the differential input buffer and each of the first and second data buffer sets 130 and 160 operates in response to the first internal clock signal CLK1_int is referred to as a "third clock distribution method".

When the memory device 100a receives data of a third frequency band from the host 10 (hereinafter referred to as a "third frequency operation"), each of the first and second data buffer sets 130 and 160 may be controlled to operate in response to the first internal clock signal CLK1_int. However, in this case, the control code CTRL may allow the first clock buffer 120 to operate as the single input buffer and the second clock buffer 150 not to operate. In other words, the first data buffer set 130 operates in response to the first internal clock signal CLK1_int provided from the first clock buffer 120, and the second data buffer set 160 operates in response to the first internal clock signal CLK1_int that is output as the third internal clock signal CLK3_int. Here, since the first clock buffer 120 operates as the single input buffer (and not the differential input buffer), power consumption may decrease. Hereinafter, a configuration in which the first clock buffer 120 operates as the single input buffer and each of the first and second data buffer sets 130 and 160 operates in response to the first internal clock signal CLK1_int is referred to as a "fourth clock distribution method".

As shown in FIG. 2, the second pad set 140 may include a second data pad set 141 and a second clock pad set 142. The second data pad set 141 may include ninth to sixteenth data pads DQ[8:15]. The ninth to sixteenth data pads DQ[8:15] may be provided with ninth to sixteenth data DATA[8:15].

Figure 3:
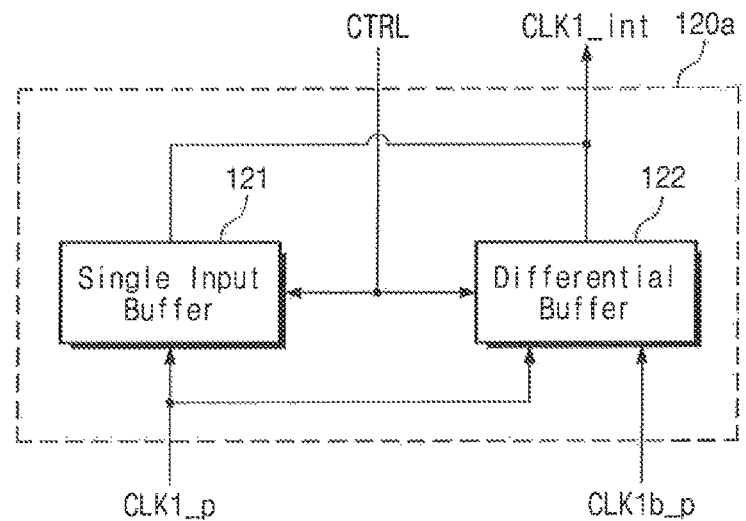
FIG. 3 is block diagram illustrating a first clock buffer illustrated in FIG. 2, according to an exemplary embodiment of the inventive concept.
Figure 4:
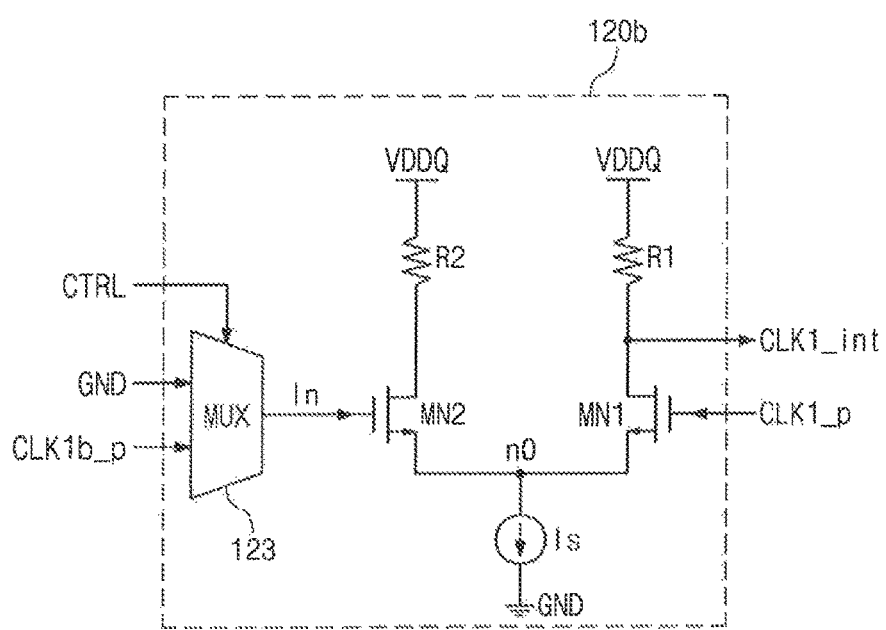
FIG. 4 is a circuit diagram illustrating the first clock buffer illustrated in FIG. 2, according to an exemplary embodiment of the inventive concept.

FIGS. 3 and 4 are block diagrams each illustrating a first clock buffer illustrated in FIG. 2 according to an exemplary embodiment of the inventive concept. First clock buffers 120a and 120b of FIGS. 3 and 4 will be described with reference to FIG. 2. The second clock buffer 150 of FIG. 2 may have the same configuration as that of one of the first clock buffer 120a of FIG. 3 and the first clock buffer 120b of FIG. 4.

Referring to FIG. 3, the first clock buffer 120a may include a single input buffer 121 and a differential input buffer 122. The single input buffer 121 is provided with the first pad clock signal CLK1_p. The single input buffer 121 amplifies the first pad clock signal CLK1_p to generate the first internal clock signal CLK1_int. The differential input buffer 122 is provided with the first pad clock signal CLK1_p and the first pad clock bar signal CLK1b_p as a differential input signal. The differential input buffer 122 amplifies the differential input signal to generate the first internal clock signal CLK1_int. Only one buffer of the single input buffer 121 and the differential input buffer 122 may operate according to the control code CTRL.

Referring to FIG. 4, the first clock buffer 120b may include a multiplexer 123, first and second resistors R1 and R2, first and second NMOS transistors MN1 and MN2, and a current source Is. The multiplexer 123 outputs one voltage or signal, which is selected according to the control code CTRL, of a ground voltage GND and the first pad clock bar signal CLK1b_p to a node In.

The first and second resistors R1 and R2, the first and second NMOS transistors MN1 and MN2, and the current source Is may constitute a differential amplifier. The first resistor R1 is connected between a first driving voltage VDDQ and a drain terminal of the first NMOS transistor MN1, and the second resistor R2 is connected between the first driving voltage VDDQ and a drain terminal of the second NMOS transistor MN2. Source terminals of the first and second NMOS transistors MN1 and MN2 are connected with a node nO. The current source Is is connected between the node nO and the ground voltage GND. A gate terminal of the first NMOS transistor MN1 is connected to receive the first pad clock signal CLK1_p as an input. A gate terminal of the second NMOS transistor MN2 is connected to receive an output of the multiplexer 123 through the node In.

When the multiplexer 123 provides the ground voltage GND to the node In in response to the control code CTRL, the second NMOS transistor NM2 is turned off. In this case, the first NMOS transistor MN1 amplifies the first pad clock signal CLK1_p received through the gate terminal thereof and outputs the amplified first pad clock signal CLK1_p as the first internal clock signal CLK1_int. In other words, the first clock buffer 120b operates as the single input buffer.

Additionally, when the multiplexer 123 provides the first pad clock bar signal CLK1b_p to the node In in response to the control code CTRL, the gate terminal of the second NMOS transistor MN2 receives the first pad clock bar signal CLK1b_p through the node In. In this case, the first clock buffer 120b is provided with the first pad clock signal CLK1_p and the first pad clock bar signal CLK1b_p through the gate terminals of the first and second NMOS transistors MN1 and MN2 as the differential input signal. The first clock buffer 120b amplifies the differential input signal to generate the first internal clock signal CLK1_int.

Figure 5:
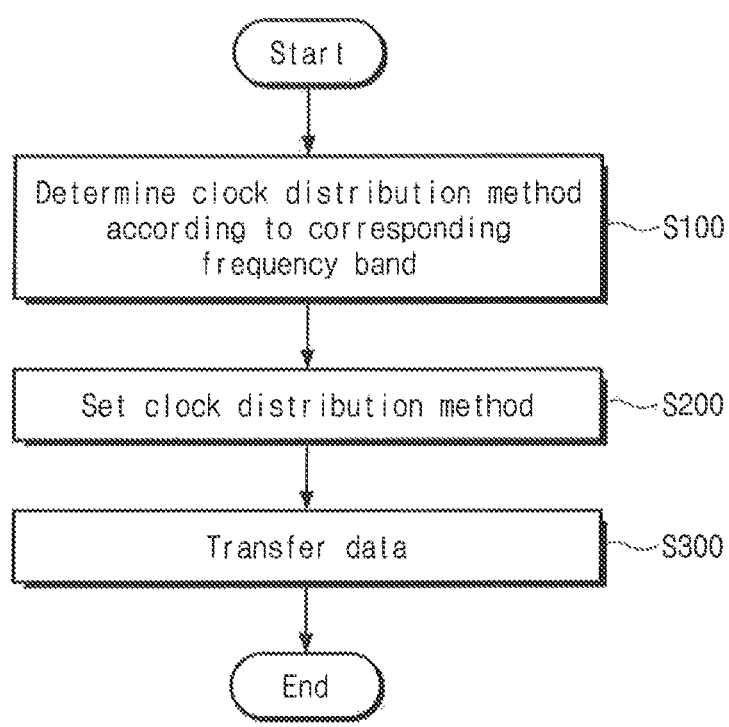
FIG. 5 is a flowchart illustrating an operation of the memory system illustrated in FIG. 1, according to an exemplary embodiment of the inventive concept.

FIG. 5 is a flowchart illustrating an operation of a memory system illustrated in FIG. 1 according to an exemplary embodiment of the inventive concept. The flowchart of FIG. 5 will be described with reference to FIGS. 1 and 2. Referring to FIG. 5, the host 10 or the memory device 100 may change a clock distribution method, in which the memory device 100 distributes the data-dedicated clock signal to an internal circuit thereof, based on a frequency band of data with which the memory device 100 is provided from the host 10.

In operation S100, a clock distribution method of the memory device 100, which correspond to the first, second, or third frequency band operation, may be determined. The clock distribution method may include the first to fourth clock distribution methods described with reference to FIG. 2. For example, the determination may be made such that the memory device 100 operates with the first clock distribution method in the first frequency band operation. In addition, the determination may be made such that the memory device 100 operates with the second clock distribution method in the second frequency band operation and operates with the third clock distribution method in the third frequency band operation. However, the inventive concept is not limited thereto. For example, various combined distribution methods may be selected according to a frequency band.

For example, a clock distribution method of the memory device 100, which corresponds to the first, second, or third frequency band operation, may be determined through training of the memory device 100 by the host 10. In other words, the host 10 may perform I/O training of the memory device 100 when the memory device 100 performs each of the first to third frequency band operations. Through the I/O training, when the memory device 100 performs each of the first to third frequency band operations, the clock distribution method may be determined based on whether a clock signal that the host 10 provides to the memory device 100 satisfies a reference transmission quality. The reference transmission quality may be determined by the host 10, a user, etc. Information of the determined clock distribution method may be stored in the host 10.

A clock distribution method of the memory device 100, which corresponds to the first, second, or third frequency band operation, may be determined upon manufacturing the memory device 100. In other words, a clock distribution method of the memory device 100 may be determined according to a result of testing the quality of I/O signals of the memory device 100 in the manufacture of the memory device 100. Information of the determined clock distribution method may be stored in the mode register 180 of the memory device 100 as the control code CTRL. Additionally, a clock distribution method of the memory device 100, which corresponds to the first, second, or third frequency band operation, may be determined by the user. Information of the determined clock distribution method may be stored in the host 10 or may be stored in the mode register 180 of the memory device 100 as the control code CTRL.

In operation S200, the memory device 100 may set the clock distribution method determined in operation S100, based on the first to third frequency band operations. For example, the clock distribution method may be set according to the MRS command provided from the host 10. In operation S300, the memory device 100 operates according to the set clock distribution method. In other words, based on the set clock distribution method, the memory device 100 receives a clock signal provided from the host 10 and synchronizes data provided from the host 10 with the received clock signal.

Figure 6:
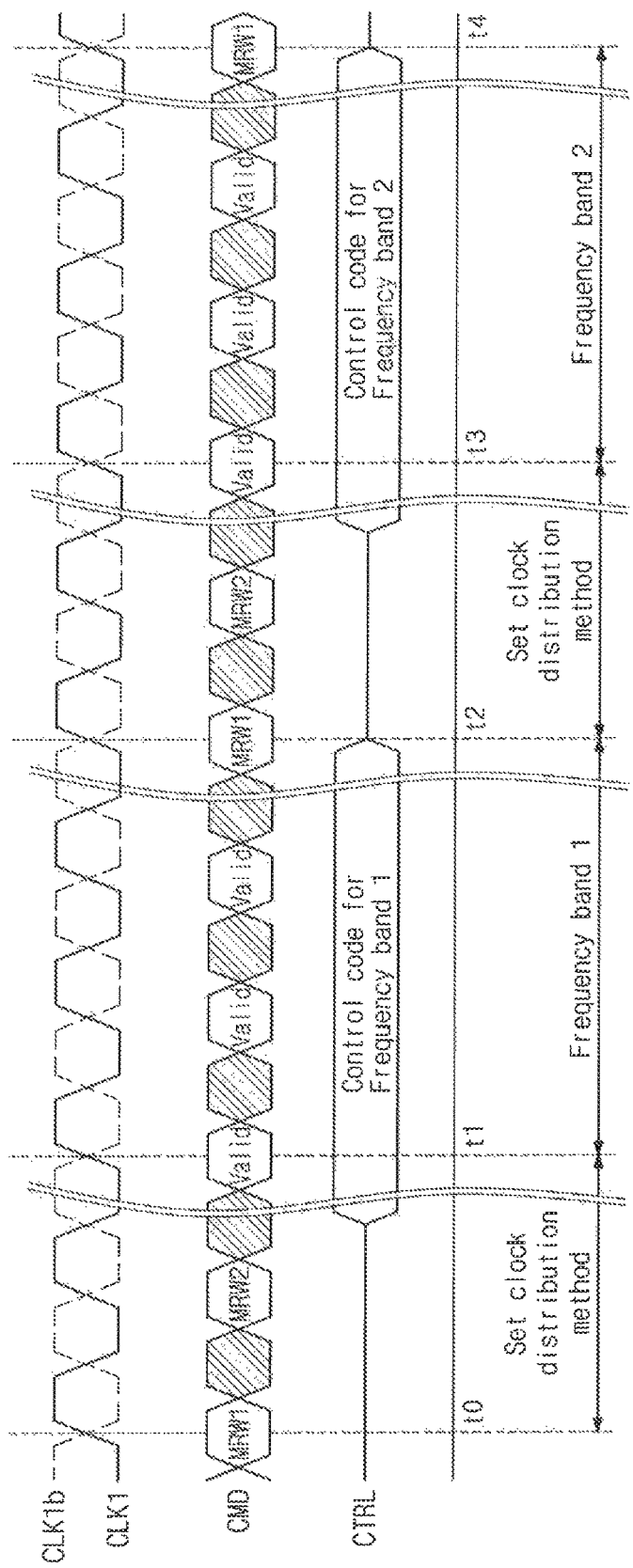
FIG. 6 is a timing diagram for describing an operation of the memory system illustrated in FIG. 1, according to an exemplary embodiment of the inventive concept.

FIG. 6 is a timing diagram for describing an operation of a memory system illustrated in FIG. 1 according to an exemplary embodiment of the inventive concept. The timing diagram of FIG. 6 will be described with reference to FIGS. 1, 2, and 5. Here, it is assumed that the memory device 100 operates with the first clock distribution method during the first frequency band operation and operates with the second clock distribution method during the second frequency band operation.

In a time period t0 to t1, the memory device 100 is provided with first and second mode register write commands MRW1 and MRW2 from the host 10. The control code CTRL for setting the first clock distribution method in the memory device 100 is stored in the mode register 180 by the first and second mode register write commands MRW1 and MRW2. After the memory device 100 is provided with the second mode register write command MRW2 and a given time elapses, the mode register 180 provides the stored control code CTRL to the first and second clock buffers 120 and 150 and the multiplexer 170. The time period t0 to t1 corresponds to operation S200 of FIG. 5.

At a point in time t1, the memory device 100 is provided with a valid command Valid from the host 10. The valid command Valid may include a write command or a read command. In a time period t1 to t2, the host 10 and the memory device 100 operate in the first frequency band. The memory device 100 is provided with the first clock signal pair CLK1/CLK1b from the host 10 according to the first clock distribution method. The memory device 100 is also provided with the second clock signal pair CLK2/CLK2b from the host 10 according to the first clock distribution method.

In a time period t2 to t3, the control code CTRL for setting the second clock distribution method in the memory device 100 is stored in the mode register 180 by the first and second mode register write commands MRW1 and MRW2. The mode register 180 provides the control code CTRL to the first and second clock buffers 120 and 150 and the multiplexer 170. The time period t2 to t3 corresponds to operation S200 of FIG. 5.

At a point in time t3, the memory device 100 is provided with a valid command Valid from the host 10. In a time period t3 to t4, the host 10 and the memory device 100 operate in the second frequency band. The memory device 100 is provided with the first clock signal pair CLK1/CLK1b and the second clock signal pair CLK2/CLK2b from the host 10 according to the second clock distribution method. Operations after the point in time t4 may be the same as the operations of the host 10 and the memory device 100 described in the time period t0 to t4. Accordingly, a description thereof is omitted.

Figure 7:
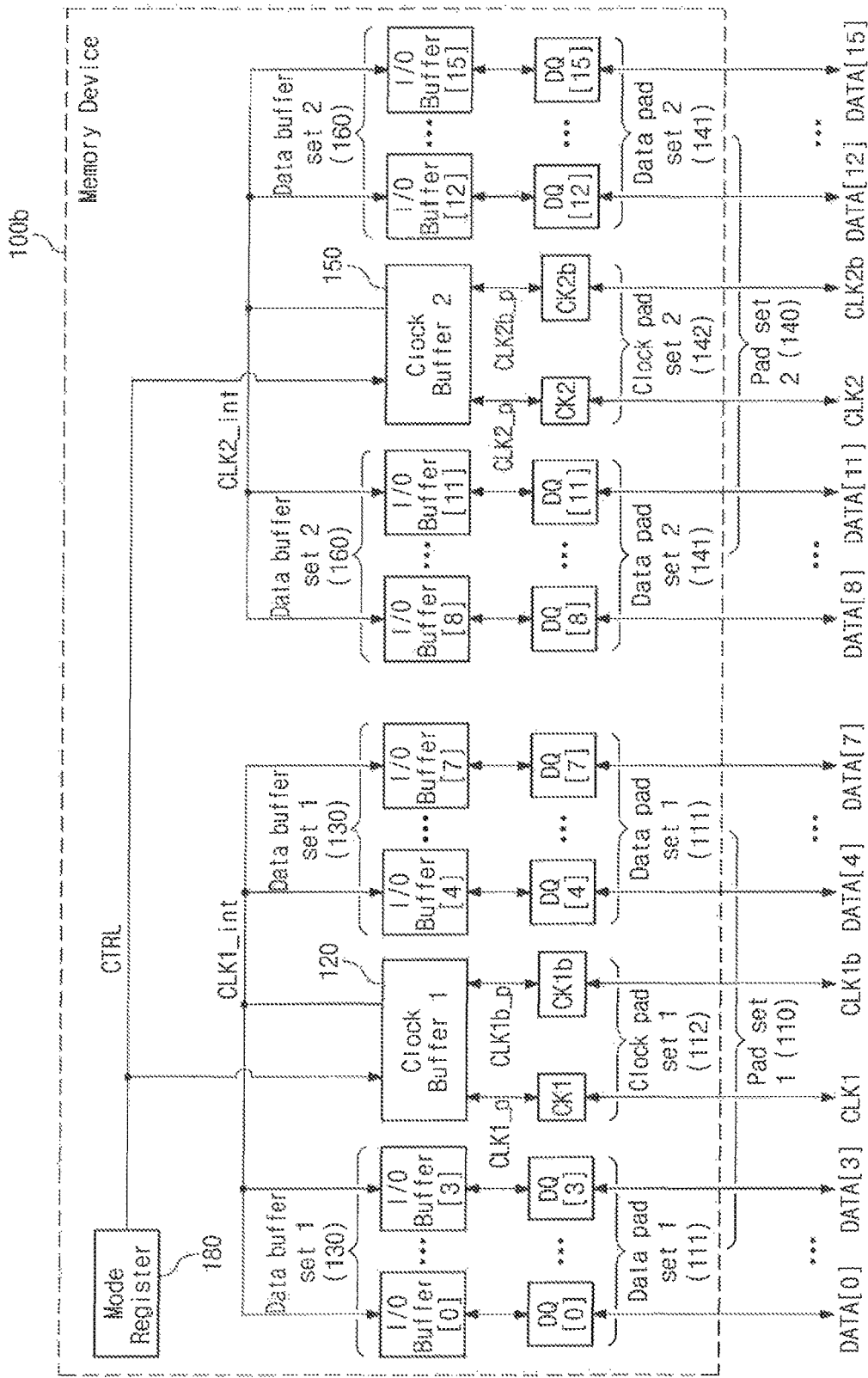
FIG. 7 is a block diagram illustrating a memory device illustrated in FIG. 1, according to an exemplary embodiment of the inventive concept.

FIG. 7 is a block diagram illustrating a memory device illustrated in FIG. 1 according to an exemplary embodiment of the inventive concept. Referring to FIG. 7, a memory device 100b may include the first pad set 110, the first clock buffer 120, the first data buffer set 130, the second pad set 140, the second clock buffer 150, the second data buffer set 160, and the mode register 180.

Compared to the memory device 100a of FIG. 2, the memory device 100b does not include the multiplexer 170 of FIG. 2. In addition, the second data buffer set 160 of the memory device 100b is directly provided with the second internal clock signal CLK2_int from the second clock buffer 150. Except for the above-described difference, configurations and operations of the first pad set 110, the first clock buffer 120, the first data buffer set 130, the second pad set 140, the second clock buffer 150, the second data buffer set 160, and the mode register 180 are substantially the same as those described with reference to FIG. 2.

The memory device 100b does not perform the second and fourth clock distribution methods (refer to FIG. 2) in which the first internal clock signal CLK1_int is provided to the first and second data buffer sets 130 and 160. In other words, the memory device 100b performs the first and third clock distribution methods (refer to FIG. 2) in which the first and second internal clock signals CLK1_int and CLK2_int are respectively provided to the first and second data buffer sets 130 and 160.

Figure 8:
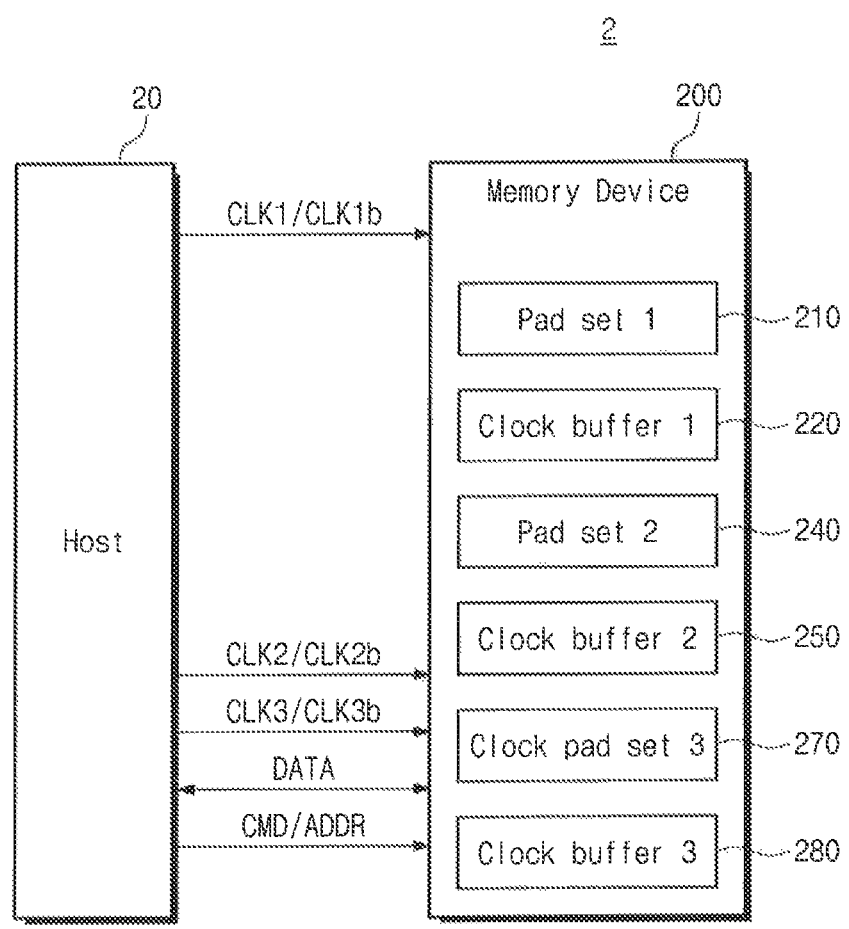
FIG. 8 is a drawing illustrating a memory system including a memory device, according to an exemplary embodiment of the inventive concept.

FIG. 8 is a drawing illustrating a memory system including a memory device, according to an exemplary embodiment of the inventive concept. Referring to FIG. 8, a memory system 2 may include a host 20 and a memory device 200. Compared to the host 10 of the memory system 1 of FIG. 1, the host 20 further provides a third clock signal pair CLK3/CLK3b dedicated to data to the memory device 200.

The memory device 200 may include a first pad set 210, a first clock buffer 220, a second pad set 240, a second clock buffer 250, a third clock pad set 270, and a third clock buffer 280. The memory device 200 may be provided with the third clock signal pair CLK3/CLK3b from the host 20 through the third clock pad set 270 and the third clock buffer 280. Except for the above-described difference, configurations and operations of the host 20, the memory device 200, the first pad set 210, the first clock buffer 220, the second pad set 240, and the second clock buffer 240 are substantially the same as those described with reference to FIG. 1. An exemplary configuration of the memory device 200 will be described with reference to FIGS. 9 and 10.

Figure 9:
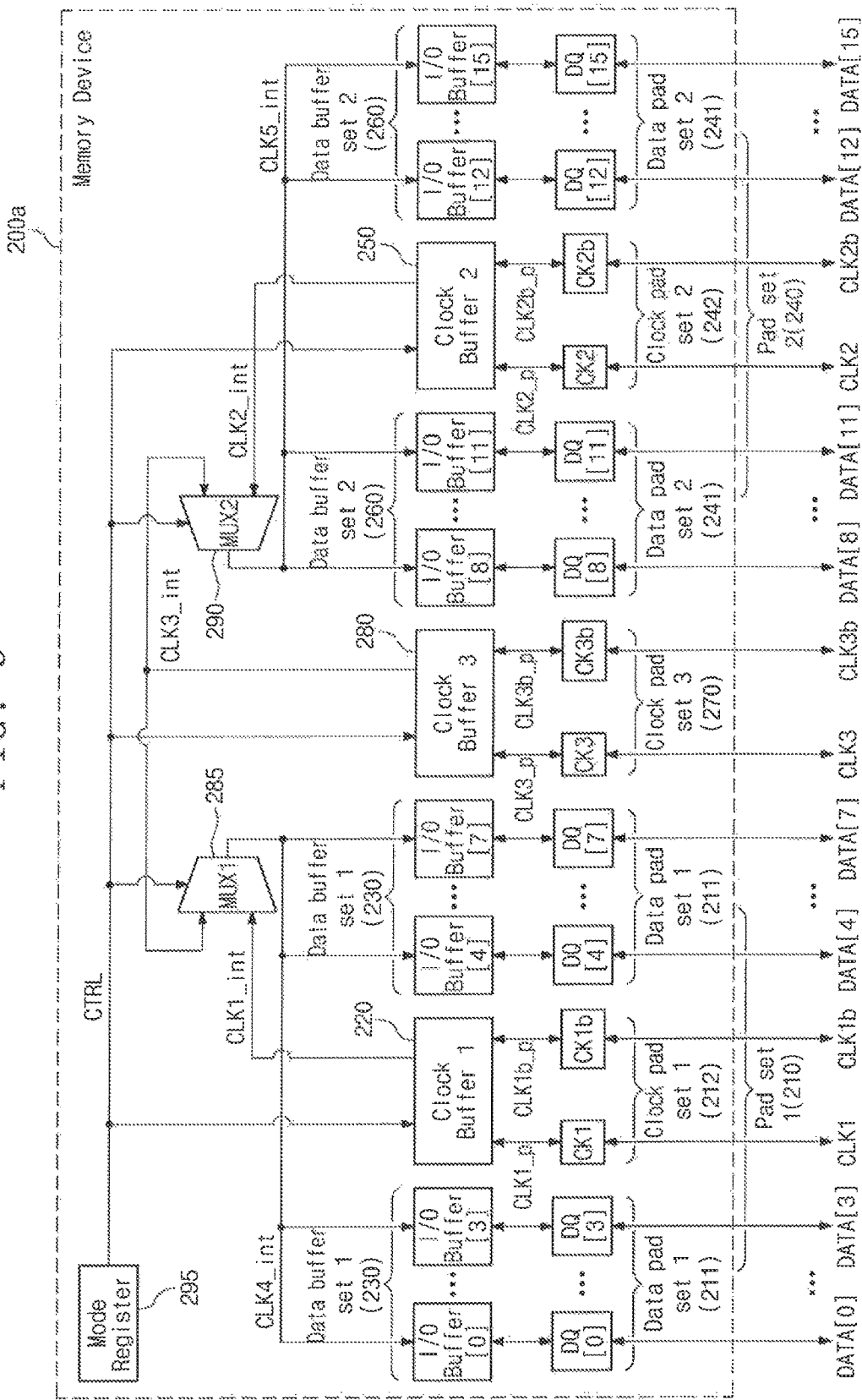
FIGS. 9 and 10 are block diagrams each illustrating a memory device illustrated in FIG. 8, according to an exemplary embodiment of the inventive concept.
Figure 10:
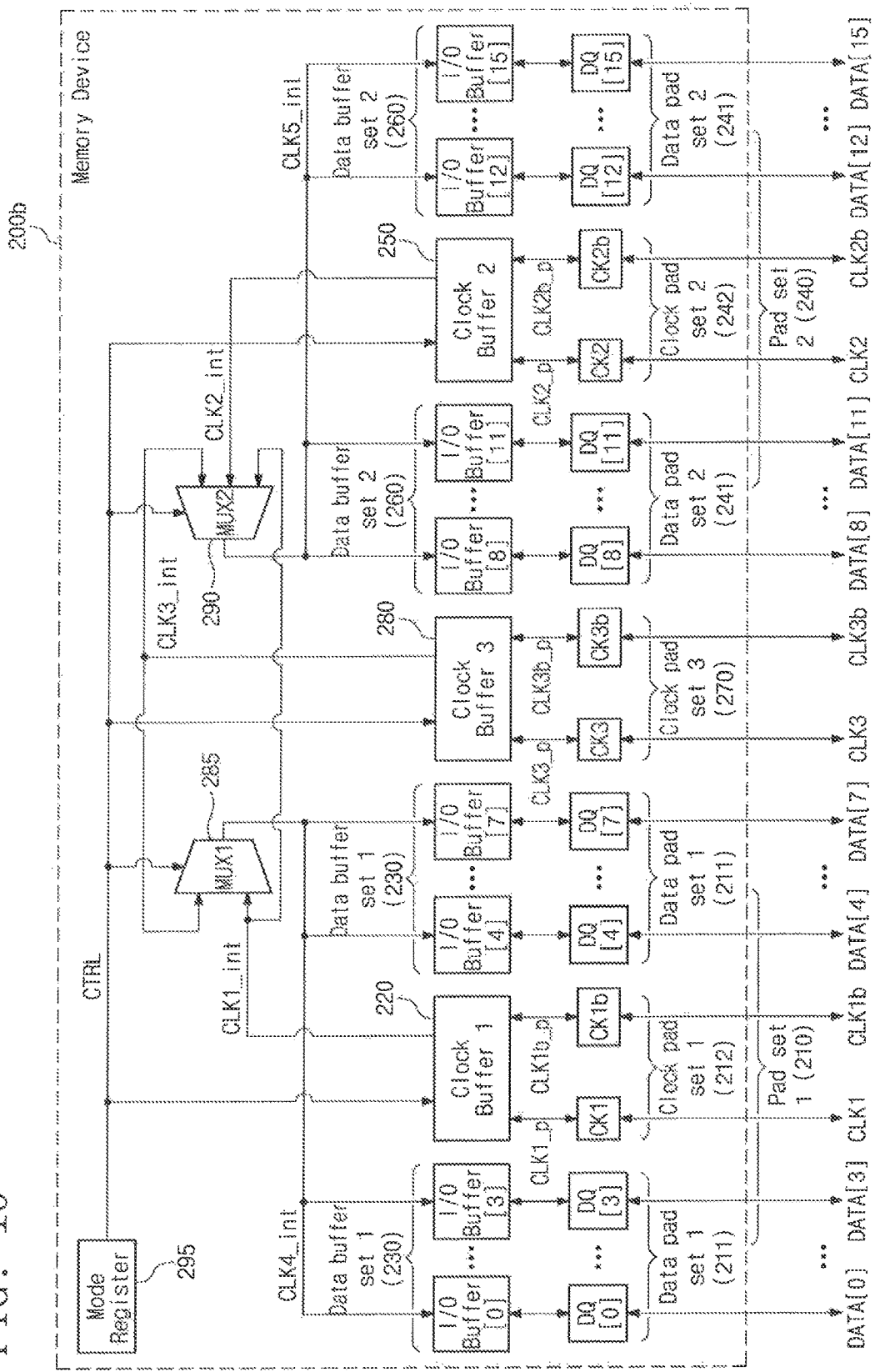

FIGS. 9 and 10 are block diagrams each illustrating a memory device illustrated in FIG. 8 according to an exemplary embodiment of the inventive concept. Memory devices 200a and 200b of FIGS. 9 and 10 will be described with reference to FIG. 8. Referring to FIGS. 9 and 10, the memory device 200 may additionally provide fifth and sixth clock distribution methods, which will be described below, in addition to the first to fourth clock distribution methods described with reference to FIG. 2.

Referring to FIG. 9, the memory device 200a may include the first pad set 210, the first clock buffer 220, a first data buffer set 230, the second pad set 240, the second clock buffer 250, a second data buffer set 260, the third clock pad set 270, the third clock buffer 280, first and second multiplexers 285 and 290, and a mode register 295.

The third clock pad set 270 may include a third clock pad CK3 and a third clock bar pad CK3b. In the write operation of the memory device 200a, the memory device 200a may be provided with the third clock signal CLK3 and the third clock bar signal CLK3b from the host 20 through the third clock pad CK3 and the third clock bar pad CK3b. Each of the third clock pad CK3 and the third clock bar pad CK3b is connected with the third clock buffer 280.

The third clock buffer 280 operates as the single input buffer or the differential input buffer based on the control code CTRL. A configuration and an operation of the third clock buffer 280 is substantially the same as a configuration and an operation of the first clock buffer 120 of FIG. 2. The third clock buffer 280 receives at least one clock signal of the third pad clock signal CLK3_p and the third pad clock bar signal CLK3b_p from the third clock pad CK3 and the third clock bar pad CLK3b and amplifies the received clock signal to generate a third internal clock signal CLK3_int. The third internal clock signal CLK3_int is provided to the first and second multiplexers 285 and 290. For example, the third internal clock signal CLK3_int may be a differential signal or a single signal.

The first multiplexer 285 is provided with the first and third internal clock signals CLK1_int and CLK3_int from the first and third clock buffers 220 and 280, respectively. The first multiplexer 285 outputs a clock signal, which is selected by the control code CTRL, of the first and third internal clock signals CLK1_int and CLK3_int as a fourth internal clock signal CLK4_int. The fourth internal clock signal CLK4_int is provided to the first data buffer set 230.

The second multiplexer 290 is provided with the second and third internal clock signals CLK2_int and CLK3_int from the second and third clock buffers 250 and 280, respectively. The second multiplexer 290 outputs a clock signal, which is selected by the control code CTRL, of the second and third internal clock signals CLK2_int and CLK3_int as a fifth internal clock signal CLK5_int. The fifth internal clock signal CLK5_int is provided to the second data buffer set 260.

Except for the third clock pad set 270, the third clock buffer 280, and the first and second multiplexers 285 and 290 described with reference to FIG. 9, configurations and operations of the first pad set 210, the first clock buffer 220, the first data buffer set 230, the second pad set 240, the second clock buffer 250, the second data buffer set 260, and the mode register 295 are substantially the same as those described with reference to FIG. 2.

An operation of the memory device 200a that is based on a frequency band of received data is as follows. First, in the first frequency operation, the first data buffer set 230 operates in response to the first internal clock signal CLK1_int provided by the first multiplexer 285. In addition, the second data buffer set 260 operates in response to the second internal clock signal CLK2_int provided by the second multiplexer 290. Each of the first and second clock buffers 220 and 250 may operate as the differential input buffer. In other words, a clock distribution method of the memory device 200a in the first frequency operation corresponds to the first clock distribution method described with reference to FIG. 2.

In the second frequency operation, like in the first clock distribution method, the first data buffer set 130 operates in response to the first internal clock signal CLK1_int provided by the first multiplexer 285, and the second data buffer set 260 operates in response to the second internal clock signal CLK2_int provided by the second multiplexer 290. Each of the first and second clock buffers 220 and 250 may operate as the single input buffer. In other words, a clock distribution method of the memory device 200a in the second frequency operation corresponds to the second clock distribution method described with reference to FIG. 2.

In the second frequency operation or the third frequency operation, the first multiplexer 285 outputs the third internal clock signal CLK3_int selected by the control code CTRL as the fourth internal clock signal CLK4_int, and the second multiplexer 290 outputs the third internal clock signal CLK3_int selected by the control code CTRL as the fifth internal clock signal CLK5_int. Accordingly, each of the first and second data buffer sets 230 and 260 operates in response to the third internal clock signal CLK3_int. In this case, the control code CTRL may allow the third clock buffer 280 to operate as the differential input buffer and the first and second clock buffers 220 and 250 not to operate. Hereinafter, a configuration in which the third clock buffer 280 operates as the differential input buffer and each of the first and second data buffer sets 230 and 260 operates in response to the third internal clock signal CLK3_int is referred to as a "fifth clock distribution method".

Additionally, in the second frequency operation or the third frequency operation, the third clock buffer 280 may operate as the single input buffer. In this case, like in the fifth clock distribution method, the first and second data buffer sets 230 and 260 are respectively provided with the third internal clock signals CLK3_int that are respectively output by the first and second multiplexers 285 and 290. Hereinafter, a configuration in which the third clock buffer 280 operates as the single input buffer and each of the first and second data buffer sets 230 and 260 operates in response to the third internal clock signal CLK3_int is referred to as a "sixth clock distribution method". In other words, the sixth clock distribution method is the same as the fifth clock distribution method except for a configuration in which the third clock buffer 280 operates as the single input buffer. Consequently, the memory device 200a may provide the first and second clock distribution methods described with reference to FIG. 2 and may further provide the fifth and sixth clock distribution methods.

Referring to FIG. 10, the memory device 200b may include the first pad set 210, the first clock buffer 220, the first data buffer set 230, the second pad set 240, the second clock buffer 250, the second data buffer set 260, the third clock pad set 270, the third clock buffer 280, the first and second multiplexers 285 and 290, and the mode register 295.

The second multiplexer 290 is provided with the first, second, and third internal clock signals CLK1_int, CLK2_int, and CLK3_int from the first, second, and third clock buffers 220, 250, and 280, respectively. The second multiplexer 290 outputs a clock signal, which is selected by the control code CTRL, of the first, second, and third internal clock signals CLK1_int, CLK2_int, and CLK3_int as the fifth internal clock signal CLK5_int. The fifth internal clock signal CLK5_int is provided to the second data buffer set 260.

Except for the configuration and the operation of the second multiplexer 290 described with reference to FIG. 10, configurations and operations of the first pad set 210, the first clock buffer 220, the first data buffer set 230, the second pad set 240, the second clock buffer 250, the second data buffer set 260, the third clock pad set 270, the third clock buffer 280, the first multiplexer 285, and the mode register 295 are substantially the same as those described with reference to FIG. 9. Accordingly, like in the memory device 200a of FIG. 9, the memory device 200b of FIG. 10 may provide the first, second, fifth, and sixth clock distribution methods.

In addition, like in the memory device 100a of FIG. 2, the memory device 200b may additionally provide the third and fourth clock distribution methods. In the case where the memory device 200b provides the third clock distribution method, the first multiplexer 285 outputs the first internal clock signal CLK1_int selected by the control code CTRL as the fourth internal clock signal CLK4_int. The fourth internal clock signal CLK4_int is provided to the first data buffer set 230. In addition, the second multiplexer 290 outputs the first internal clock signal CLK1_int as the fifth internal clock signal CLK5_int. The fifth internal clock signal CLK5_int is provided to the second data buffer set 260. The first clock buffer 220 operates as the differential input buffer. Accordingly, each of the first and second data buffer sets 230 and 260 is provided with the first internal clock signal CLK1_int that is generated by the first clock buffer 220 operating as the differential input buffer.

In the case where the memory device 200b provides the fourth clock distribution method, like in the third clock distribution method, the first and second multiplexers 285 and 290 output the first internal clock signal CLK1_int as the fourth and fifth internal clock signals CLK4_int and CLK5_int, respectively. The first clock buffer 220 operates as the single input buffer. Accordingly, each of the first and second data buffer sets 230 and 260 is provided with the first internal clock signal CLK1_int that is generated by the first clock buffer 220 operating as the single input buffer. In the third and fourth clock distribution methods, the second and third clock buffers 250 and 280 may not operate.

In FIGS. 9 and 10, an exemplary embodiment of the inventive concept is illustrated with the third clock pad set 270 arranged between the first pad set 210 and the second pad set 240 and with the third clock buffer 280 arranged between the first data buffer set 230 and the second data buffer set 260. This is to provide the third internal clock signal CLK3_int, which is generated through the third clock pad set 270 and the third clock buffer 280, to each of the first and second data buffer sets 230 and 260 as equally as possible when each of the memory devices 200a and 200b operates in the fifth clock distribution method or the sixth distribution method. However, the inventive concept is not limited thereto. For example, the first and second pad sets 210 and 240 and the third clock pad set 270 may be arranged in an order that is different from that described above. In addition, the first and second data buffer sets 230 and 260 and the third clock buffer 280 may be arranged in an order that is different from that described above.

Figure 11:
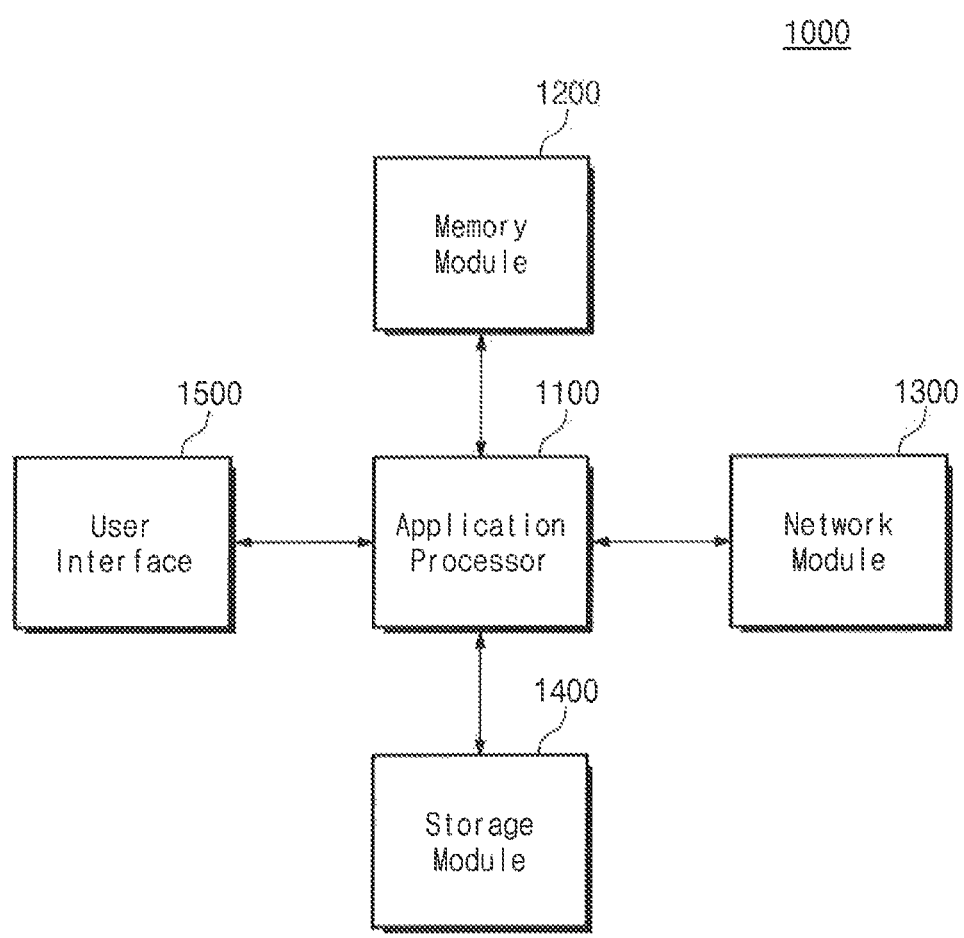
FIG. 11 is a block diagram illustrating a user system to which a memory device according to an exemplary embodiment of the inventive concept is applied.

FIG. 11 is a block diagram illustrating a user system to which a memory device according to an exemplary embodiment of the inventive concept is applied. Referring to FIG. 11, a user system 1000 may include an application processor 1100, a memory module 1200, a network module 1300, a storage module 1400, or a user interface 1500.

The application processor 1100 may drive elements and an operating system that are included in the user system 1000. In an exemplary embodiment of the inventive concept, the application processor 1100 may include controllers for controlling elements of the user system 1000, interfaces, graphics engines, etc. The application processor 1100 may be a system-on-chip (SoC).

The memory module 1200 may operate as a main memory, a working memory, a buffer memory, or a cache memory of the user system 1000. The memory module 1200 may be a volatile random access memory, such as a DRAM, a synchronous DRAM (SDRAM), a double date rate (DDR) SDRAM, a DDR2 SDRAM, a DDR3 SDRAM, a low power DDR (LPDDR) SDRAM, an LPDDR2 SDRAM, or an LPDDR3 SDRAM or a nonvolatile random access memory, such as a phase-change RAM (PRAM), a magnetic RAM (MRAM), a resistive RAM (RRAM), or a ferroelectric RAM (FRAM).

For example, a controller, which is included in the application processor 1100, and the memory module 1200 may constitute the memory system 1 described with reference to FIGS. 1 to 7 or the memory system 2 described with reference to FIGS. 8 to 10. In other words, the controller included in the application processor 1100 may correspond to one of the hosts 10 and 20 of FIGS. 1 and 8, and the memory module 1200 may include one of the memory devices 100 and 200 of FIGS. 1 and 8.

The network module 1300 may communicate with external devices. For example, the network module 1300 may support wireless communications, such as code division multiple access (CDMA), global system for mobile communication (GSM), wideband CDMA (WCDMA), CDMA-2000, time division multiple access (TDMA), long term evolution (LTE), Wimax, wireless local area network (WLAN), ultra-wideband (UWB), Bluetooth, and wireless display (WI-DI). Here, the network module 1300 may be included in the application processor 1100.

The storage module 1400 may store data. For example, the storage module 1400 may store data received from the application processor 1100. Additionally, the storage module 1400 may transmit data stored therein to the application processor 1100. For example, the storage module 1400 may bea nonvolatile semiconductor memory device such as a PRAM, an MRAM, a RRAM, a NAND flash memory, a NOR flash memory, or a three-dimensional NAND flash memory.

The user interface 1500 may include interfaces which input data or a command to the application processor 1100 or output data to an external device. For example, the user interface 1500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 1500 may further include user output interfaces such as a liquid crystal display (LCD), an organic light-emitting diode (OLED) display device, an active matrix OLED (AMOLED) display device, a light-emitting diode (LED), a speaker, and a monitor.

According to an exemplary embodiment of the inventive concept, a memory system may optimize the quality of a clock signal and the efficiency of power consumption based on a frequency band, thereby increasing a lifetime of a battery that the memory system uses.

While the inventive concept has been described with reference to exemplary embodiments thereof, it will be apparent to those skilled in the art that various changes and modifications may be made thereto without departing from the spirit and scope of the inventive concept as defined by the claims. Therefore, it should be understood that the above embodiments are not limiting, but illustrative.

What is claimed is:
1. A memory device, comprising:
a first data buffer set configured to receive data of a first frequency band or data of a second frequency band from a host, wherein the second frequency band is lower in frequency than the first frequency band;
a first clock buffer configured to provide a clock signal of the first frequency band to the first data buffer set when the first data buffer set receives the data of the first frequency band and to provide a clock signal of the second frequency band to the first data buffer set when the first data buffer set receives the data of the second frequency band;
a second data buffer set configured to receive the data of the first frequency band or the data of the second frequency band from the host and to receive the clock signal of the second frequency band from the first clock buffer in response to receiving the data of the second frequency band; and
a second clock buffer configured to provide the clock signal of the first frequency band to the second data buffer set in a first frequency band operation in which each of the first and second data buffer sets receives the data of the first frequency band.

2. The memory device of claim 1, wherein the second clock buffer does not operate in a second frequency band operation in which each of the first and second data buffer sets receives the data of the second frequency band.

3. The memory device of claim 1, wherein each of the first and second clock buffers operate as a differential input buffer when the first and second clock buffers provide the clock signal of the first frequency band to the first and second data buffer sets in the first frequency band operation, respectively.

4. The memory device of claim 3, wherein the first clock buffer operates as the differential input buffer when the first clock buffer provides the clock signal of the second frequency band to each of the first and second data buffer sets in a second frequency band operation.

5. The memory device of claim 3, wherein the first clock buffer operates as a single input buffer when the first clock buffer provides the clock signal of the second frequency band to each of the first and second data buffer sets in a second frequency band operation.

6. The memory device of claim 3, wherein in a third frequency band operation in which each of the first and second data buffer sets receives data of a third frequency band, the first and second clock buffers provide a clock signal of the third frequency band to the first and second data buffer sets respectively, and each of the first and second clock buffers operates as a single input buffer, wherein the third frequency band is lower in frequency than the first frequency band.

7. The memory device of claim 1, further comprising:
a multiplexer configured to select a clock signal transferred from the second clock buffer in the first frequency band operation or a clock signal transferred from the first clock buffer in a second frequency band operation and to provide the selected clock signal to the second data buffer set.

8. The memory device of claim 1, further comprising:
a mode register configured to store a control code that controls operations providing a clock signal of the first and second clock buffers and to provide the stored control code to the first clock buffer or the second clock buffer, wherein the control code is provided from the host to the mode register.

9. The memory device of claim 1, further comprising:
a third clock buffer configured to provide a clock signal of a third frequency band to each of the first and second data buffer sets in a third frequency band operation.

10. The memory device of claim 9, wherein the third clock buffer is arranged between the first clock buffer and the second clock buffer.

11. The memory device of claim 9, further comprising:
a first multiplexer configured to select a clock signal transferred from the first clock buffer in the first frequency band operation or a clock signal transferred from the third clock buffer in the third frequency band operation and to provide the selected clock signal to the first data buffer set; and
a second multiplexer configured to select a clock signal transferred from the second clock buffer in the first frequency band operation, the clock signal transferred from the first clock buffer in a second frequency band operation, or the clock signal transferred from the third clock buffer in the third frequency band operation and to provide the selected clock signal to the second data buffer set.

12. The memory device of claim 9, further comprising:
a clock signal pad set for transferring a clock signal received from the host to the third clock buffer.

13. A clock signal providing method of a memory device, the method comprising:
determining a clock distribution method of the memory device such that first and second clock buffers included in the memory device provide a clock signal of a first frequency band to first and second data buffer sets included in the memory device respectively in a first frequency band operation and such that the first clock buffer provides a clock signal of a second frequency band to each of the first and second data buffer sets in a second frequency band operation, wherein the second frequency band is lower in frequency than the first frequency band; and
setting, at the memory device, the determined clock distribution method for each of the first and second frequency bands of the clock signals, when the memory device receives data from a host.

14. The method of claim 13, wherein the determining of the clock distribution method comprises:
allowing the first and second clock buffers to provide a clock signal of a third frequency band to the first and second data buffer sets, respectively in a third frequency band operation, wherein the third frequency band is lower in frequency than the first frequency band; and
wherein each of the first and second clock buffers operates as a single input buffer.

15. The method of claim 13, wherein the determining of the clock distribution method comprises:
determining a clock distribution method of the memory device such that a third clock buffer included in the memory device provides a clock signal of a third frequency band to each of the first and second data buffer sets in a third frequency band operation; and
wherein the third clock buffer is arranged between the first clock buffer and the second clock buffer.

16. A memory device, comprising:
a first clock buffer configured to receive a first clock signal pair and output a first internal clock signal that corresponds to one of the first clock signal pair in response to a control signal;
a first data buffer set configured to receive the first internal clock signal;
a second clock buffer configured to receive a second clock signal pair and output a second internal clock signal that corresponds to one of the second clock signal pair in response to the control signal;
a multiplexer configured to receive the first and second internal clock signals and output one of the first and second internal clock signals as a third internal clock signal in response to the control signal; and
a second data buffer set configured to receive the third internal clock signal.

17. The memory device of claim 16, wherein the first clock buffer is disposed between a first portion of the first data buffer set and a second portion of the first data buffer set.

18. The memory device of claim 16, wherein the second clock buffer is disposed between a first portion of the second data buffer set and a second portion of the second data buffer set.

19. The memory device of claim 16, wherein the first clock buffer includes a single input buffer and a differential input buffer.

20. The memory device of claim 19, wherein the single input buffer and the differential input buffer operate one at a time in response to the control signal.

* * * * *